United States Patent
Araki et al.

(10) Patent No.: US 11,237,582 B2
(45) Date of Patent: Feb. 1, 2022

(54) POWER SUPPLY DEVICE AND ELECTRONIC APPARATUS TO SUPPLY STABLE VOLTAGE TO NORMAL DEVICE

(71) Applicant: FUJITSU LIMITED, Kawasaki (JP)

(72) Inventors: Tatsuo Araki, Kawasaki (JP); Hironobu Kageyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/791,026

(22) Filed: Feb. 14, 2020

(65) Prior Publication Data

US 2020/0272181 A1    Aug. 27, 2020

(30) Foreign Application Priority Data

Feb. 27, 2019  (JP) .............................. JP2019-034646

(51) Int. Cl.
| | | |
|---|---|---|
| *G05F 1/565* | (2006.01) | |
| *G01R 19/165* | (2006.01) | |
| *H02M 7/04* | (2006.01) | |

(52) U.S. Cl.
CPC ....... *G05F 1/565* (2013.01); *G01R 19/16571* (2013.01); *H02M 7/04* (2013.01)

(58) Field of Classification Search
CPC ............. H02M 3/156–158; H02M 3/335–337
USPC ..................... 361/86, 89, 90, 91.1, 93.4, 91; 323/271–289; 320/134, 136; 307/114
See application file for complete search history.

(56) References Cited

U.S. PATENT DOCUMENTS

| | | | | |
|---|---|---|---|---|
| 6,219,215 | B1 * | 4/2001 | Bertin ................. | H01L 23/5256 361/93.8 |
| 9,601,987 | B2 * | 3/2017 | Motojima ............... | G05F 1/618 |
| 9,960,695 | B2 * | 5/2018 | Yonezawa ............... | H02M 1/32 |
| 2005/0096877 | A1 * | 5/2005 | Shimazaki .......... | G06F 11/3433 702/186 |
| 2005/0268164 | A1 * | 12/2005 | Hara ................... | H04W 52/028 714/14 |
| 2006/0203524 | A1 * | 9/2006 | Ohno ...................... | H02M 1/32 363/95 |
| 2007/0030068 | A1 * | 2/2007 | Motonobu .............. | F16H 61/12 330/257 |
| 2008/0093924 | A1 * | 4/2008 | Matsumoto ............ | H02H 7/268 307/10.1 |
| 2008/0304198 | A1 * | 12/2008 | Chishima ............... | H02H 3/087 361/93.7 |
| 2009/0116161 | A1 * | 5/2009 | Takahashi ............ | H03K 17/687 361/100 |
| 2011/0133715 | A1 * | 6/2011 | Zushi ..................... | H03K 17/18 323/285 |

(Continued)

FOREIGN PATENT DOCUMENTS

JP        7-210275        8/1995

*Primary Examiner* — Thienvu V Tran
*Assistant Examiner* — Nusrat Quddus
(74) *Attorney, Agent, or Firm* — Staas & Halsey, LLP

(57) ABSTRACT

A power supply device includes a power supply circuit configured to generate a direct current output voltage to be applied to both ends of a plurality of loads serially coupled, a detection circuit configured to detect an anomaly of a load voltage applied to each of the plurality of loads, and an adjustment circuit configured to decrease the output voltage in accordance with a number of abnormal loads where the anomaly is detected among the plurality of loads.

15 Claims, 6 Drawing Sheets

(56) References Cited

U.S. PATENT DOCUMENTS

| | | | |
|---|---|---|---|
| 2013/0049737 A1* | 2/2013 | Hattori | G01R 19/16571 |
| | | | 324/76.11 |
| 2018/0316225 A1* | 11/2018 | Yeo | H02M 7/2173 |
| 2018/0335818 A1* | 11/2018 | Mattos | G06F 1/266 |
| 2019/0306469 A1* | 10/2019 | Jing | G05F 1/467 |
| 2020/0278713 A1* | 9/2020 | Hashemi | G06F 1/28 |
| 2020/0310505 A1* | 10/2020 | Suzuki | G05F 1/46 |

* cited by examiner

POWER SUPPLY DEVICE AND ELECTRONIC APPARATUS TO SUPPLY STABLE VOLTAGE TO NORMAL DEVICE

CROSS-REFERENCE TO RELATED APPLICATION

This application is based upon and claims the benefit of priority of the prior Japanese Patent Application No. 2019-34646, filed on Feb. 27, 2019, the entire contents of which are incorporated herein by reference.

FIELD

The embodiments discussed herein are related to a power supply device and an electronic apparatus.

BACKGROUND

A control apparatus including n circuit blocks coupled in series to a direct current voltage source and a voltage detection circuit that detects a voltage applied to each of the n circuit blocks has been proposed. This control apparatus increases an impedance of the circuit block where a voltage lower than 1/n of a voltage of the direct current voltage source is detected, and decreases the impedance of the circuit block where a voltage higher than 1/n of the voltage of the direct current voltage source is detected. A technology has been proposed in which voltages applied to respective circuit blocks are respectively adjusted to 1/n of a voltage of a direct current voltage by adjusting impedances of the respective circuit blocks according to detected voltages in the aforementioned manner (for example, see Japanese Laid-open Patent Publication No. 7-210275).

SUMMARY

According to an aspect of the embodiments, a power supply device includes a power supply circuit configured to generate a direct current output voltage to be applied to both ends of a plurality of loads serially coupled, a detection circuit configured to detect an anomaly of a load voltage applied to each of the plurality of loads, and an adjustment circuit configured to decrease the output voltage in accordance with a number of abnormal loads where the anomaly is detected among the plurality of loads.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

According to a related-art technology, since an impedance of a circuit block is adjusted by performing control for enhancing or reducing a computation function of the circuit block or coupling a current limit device to the circuit block, a range in which the impedance may be adjusted is limited. For this reason, when a voltage anomaly that exceeds the adjustment range of the impedance (that is, for example, a voltage anomaly is not to be coped with by the impedance adjustment) occurs in any of a plurality of loads coupled in series to a direct current power supply, a stable voltage is not supplied to the remaining normal loads in some cases.

Hereafter, embodiments of a technology in which the stable voltage may be supplied to the remaining normal loads even when the voltage anomaly occurs in any of the plurality of loads coupled in series to the direct current power supply are described with reference to the drawings.

Figure 1:
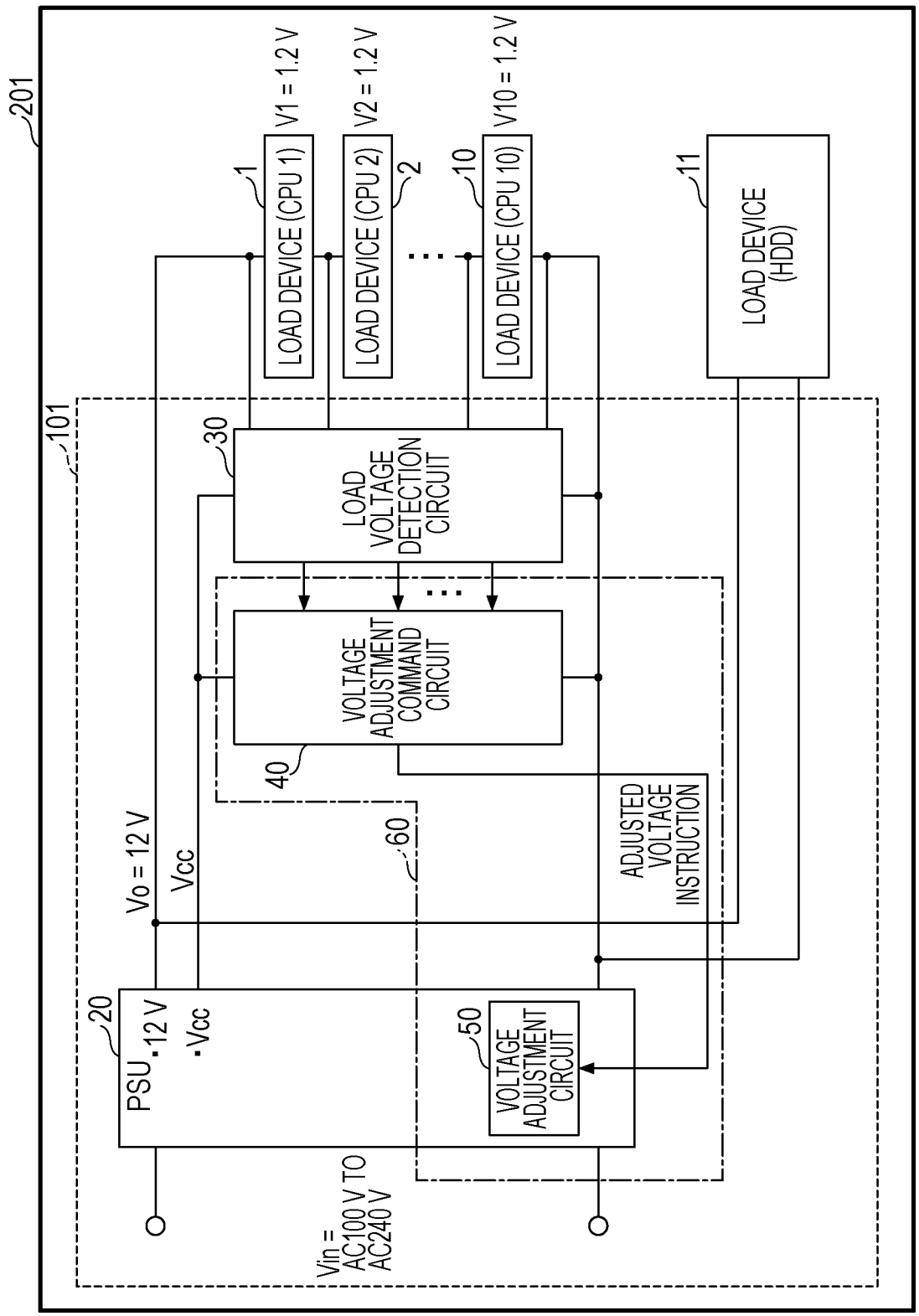
FIG. 1 is a diagram illustrating a configuration example of an electronic apparatus according to a first embodiment.

FIG. 1 is a diagram illustrating a configuration example of an electronic apparatus according to a first embodiment. An electronic apparatus 201 illustrated in FIG. 1 includes a power supply device 101 that generates direct current power and operates using the direct current power generated by the power supply device 101. The power supply device 101 may be built in the electronic apparatus 201 or may be externally attached. Specific examples of the electronic apparatus 201 include a server, a personal computer, a mobile terminal apparatus, and the like, but the electronic apparatus 201 according to the present embodiment are not limited to these apparatuses. The same applies to the electronic apparatus according to another embodiment described below.

The electronic apparatus 201 includes a plurality of serially coupled load devices 1 to n in addition to the power supply device 101. n is an integer higher than or equal to 2 and represents the number of the plurality of serially coupled load devices. The technology of the present disclosure may be applied to a case where the number of the plurality of serially coupled load devices is 2 or more. FIG. 1 exemplifies 10 serially coupled load devices 1 to 10.

The load devices 1 to n are loads serially fed by the power supply device 101 using an output voltage Vo generated by the power supply device 101. The load devices 1 to n respectively operate by voltages obtained by dividing the output voltage Vo. For example, the load devices 1 to n include mutually same circuit configurations in which rated voltages are mutually same. The load devices 1 to n may be respectively single devices, or a circuit block including a plurality of devices. FIG. 1 exemplifies 10 serially coupled central processing units (CPUs).

The electronic apparatus 201 may also include at least one load device 11 separately in addition to the plurality of serially coupled load devices 1 to n. The load device 11 is a load device that is not coupled in series to the load devices 1 to n. The output voltage Vo generated by the power supply device 101 is applied to both ends of the load device 11. For example, the load device 11 includes a storage device such as a hard drive disk (HDD).

The power supply device 101 includes a power supply unit (PSU) 20, a load voltage detection circuit 30, and an adjustment circuit 60. The adjustment circuit 60 includes a voltage adjustment command circuit 40 and a voltage adjustment circuit 50. FIG. 1 exemplifies a case where the voltage adjustment circuit 50 exists inside the PSU 20, but the voltage adjustment circuit 50 may exist outside the PSU 20.

Next, these components in the power supply device 101 are described.

The PSU 20 is one example of a direct current power supply that applies the direct current output voltage Vo to both ends of the plurality of serially coupled load devices 1 to n. For example, the PSU 20 converts alternating current power of an input voltage Vin input from the outside into direct current power of the output voltage Vo and supplies the converted direct current power to the plurality of load devices 1 to n. For example, the PSU 20 converts the alternating current power of the input voltage Vin at AC100 to AC240 [volt (V)] into the direct current power of the output voltage Vo at DC12 [V]. AC and DC are respectively abbreviations of "alternating current" and "direct current". The PSU 20 may also be a circuit that converts direct current power input from the outside into the direct current power of the output voltage Vo.

The PSU 20 generates a circuit power supply voltage Vcc applied to the load voltage detection circuit 30 and the adjustment circuit 60. For example, the PSU 20 converts the alternating current or direct current input voltage Vin input from the outside into the direct current circuit power supply voltage Vcc.

The load voltage detection circuit 30 detects load voltages V1 to Vn applied to both ends of the plurality of respective load devices 1 to n and detects anomalies of the respective detected load voltages V1 to Vn. Since the n load devices are coupled in series, in a state where the anomalies of the load voltages V1 to Vn are not detected, voltage values of the load voltages V1 to Vn become a value obtained by equally dividing a voltage value of the output voltage Vo by n (=Vo/n). In this case, each of the load devices 1 to n operates at the load voltage of the voltage value (Vo/n). For example, when the voltage value v of the output voltage Vo in a state where the anomalies of the load voltages V1 to Vn are not detected is 12 volts, the voltage value of load voltages V1 to V10 of 10 respective load devices 1 to 10 are 1.2 volts.

The number of the plurality of serially coupled load devices is set as n, and the voltage value of the output voltage Vo in a state where the anomalies of the load voltages V1 to Vn are not detected is set as v. At this time, the load voltage detection circuit 30 detects an abnormal decrease in the load voltages V1 to Vn by detecting that the voltage values of the load voltages V1 to Vn are low with respect to a threshold VL set to be lower than (v/n). For example, in the case of n=10 and v=12 [V], the threshold VL is set as a voltage value lower than 1.2 (=12/10) volts. When the set value of the threshold VL is too high, since an erroneous detection of the abnormal decrease in the load voltages V1 to Vn is caused, an upper limit value of the threshold VL is preferably, for example, lower than or equal to (v/n)×0.5, and more preferably lower than or equal to (v/n)×0.4. A lower limit value of the threshold VL may also be zero or a negative value.

One example of the abnormal decrease in the load voltages V1 to Vn is a voltage decrease accompanied by a short-circuit failure of the load devices 1 to n. The voltage decrease accompanied by the short-circuit failure may be a voltage decrease in mid-course where the load in which the abnormal voltage decrease is detected leads to the short-circuit failure or may also be a voltage decrease state after the load in which the abnormal voltage decrease is detected has reached the short-circuit failure.

Figure 2:
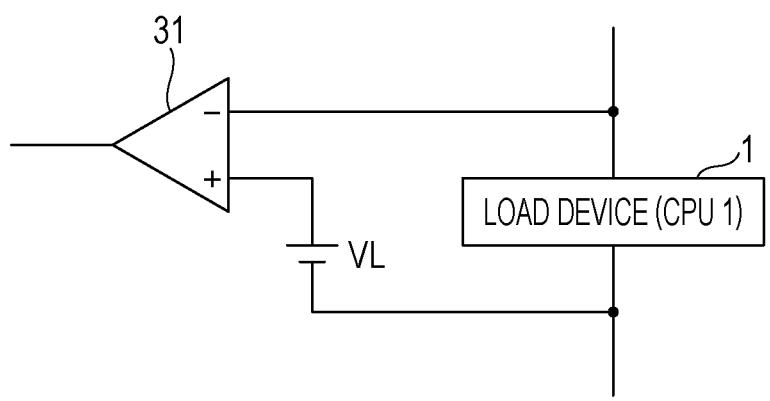
FIG. 2 is a diagram illustrating a configuration example of part of a load voltage detection circuit according to the first embodiment.

FIG. 2 is a diagram illustrating a configuration example of part of the load voltage detection circuit 30 according to the first embodiment. For example, the load voltage detection circuit 30 includes a plurality of voltage detectors coupled in parallel to corresponding load devices among the plurality of load devices 1 to n. FIG. 2 illustrates a comparator 31 coupled in parallel to the load device 1 as one example of the voltage detector. The comparator 31 detects the load voltage V1 applied to the load device 1. The load voltage detection circuit 30 detects the abnormal decrease in each of the load voltages V1 to Vn by comparing each of the load voltages V1 to Vn with the threshold VL by n comparators 31.

The comparator 31 corresponding to the load voltage V1 outputs an anomaly detection signal representing the presence or absence of the detection of the abnormal decrease in the load voltage V1. When the load voltage V1 is higher than the threshold VL, the comparator 31 sets a level of the anomaly detection signal corresponding to the load device 1 to a non-active level (for example, a low level) representing that the abnormal decrease in the load voltage V1 is not detected. When the load voltage V1 is lower than the threshold VL, the comparator 31 sets the level of the anomaly detection signal corresponding to the load device 1 to an active level (for example, a high level) representing that the abnormal decrease in the load voltage V1 is detected. The same applies to the comparators 31 respectively corresponding to the other load voltages V2 to Vn.

In FIG. 1, the adjustment circuit 60 decreases the voltage value of the output voltage Vo in accordance with the number of load devices (abnormal loads) where the abnormal decrease in the load voltage is detected by the load voltage detection circuit 30 among the plurality of load devices 1 to n. When a voltage anomaly (abnormal voltage decrease in this case) occurs in any load device among the load devices 1 to n, each of the load voltages applied to the remaining normal load devices becomes unstable. However, since the adjustment circuit 60 decreases the voltage value of the output voltage Vo in accordance with the number of abnormal loads, the stable voltage may be continually supplied to the remaining normal load devices.

The adjustment circuit 60 includes the voltage adjustment command circuit 40 and the voltage adjustment circuit 50.

The voltage adjustment command circuit 40 outputs a command signal for instructing adjustment of the output voltage Vo in accordance with the number of abnormal loads. The voltage adjustment command circuit 40 outputs a command signal for adjusting the voltage value of the output voltage Vo by an adjustment amount corresponding to the number of abnormal loads.

The voltage adjustment circuit 50 adjusts the output voltage Vo to a target voltage value. For example, the voltage adjustment circuit 50 controls at least one switching device in the PSU 20 such that the output voltage Vo converges to the target voltage value. The voltage adjustment circuit 50 changes the target voltage value in accordance with the command signal from the voltage adjustment command circuit 40 to adjust the voltage value of the output voltage Vo by the adjustment amount corresponding to the number of abnormal loads.

For example, the number of the plurality of serially coupled load devices is set as n, the voltage value of the output voltage Vo in a state where the anomalies of the load voltages V1 to Vn are not detected is set as v, and the number of abnormal loads is set as m. At this time, the voltage value of each of the load voltages V1 to Vn in a state where the anomalies are not detected is (v/n). When short-circuit failure occurs in m load devices among the plurality of load devices 1 to n, the voltage value of the load voltage of the m abnormal loads where the short-circuit failure occurs decreases to 0 volt, and the voltage value of the load voltage of each of the remaining normal load devices where the short-circuit failure does not occur increases to (v/(n−m)) volts. The voltage adjustment command circuit 40 outputs a command signal for decreasing the voltage value of the output voltage Vo by the adjustment mount ((v/n)×m). The voltage adjustment circuit 50 decreases the voltage value of the output voltage Vo to (v−(v/n)×m) following the command signal.

v−(v/n)×m may be transformed as follows.

$$v - (v/n) \times m = (1 - (m/n)) \times v \quad (1)$$
$$= ((n - m)/n) \times v$$

That is, for example, when the voltage value of the output voltage Vo is decreased to v−(v/n)×m, the voltage value of the load voltage of each of the remaining normal load devices where the short-circuit failure does not occur increases to the value (v/n) obtained by equally dividing Expression 1 by the number of normal load devices (n−m). In this manner, the voltage value of the load voltage of the (n−m) normal load devices may be returned to the voltage value (v/n) before the anomaly occurs.

Figure 3:
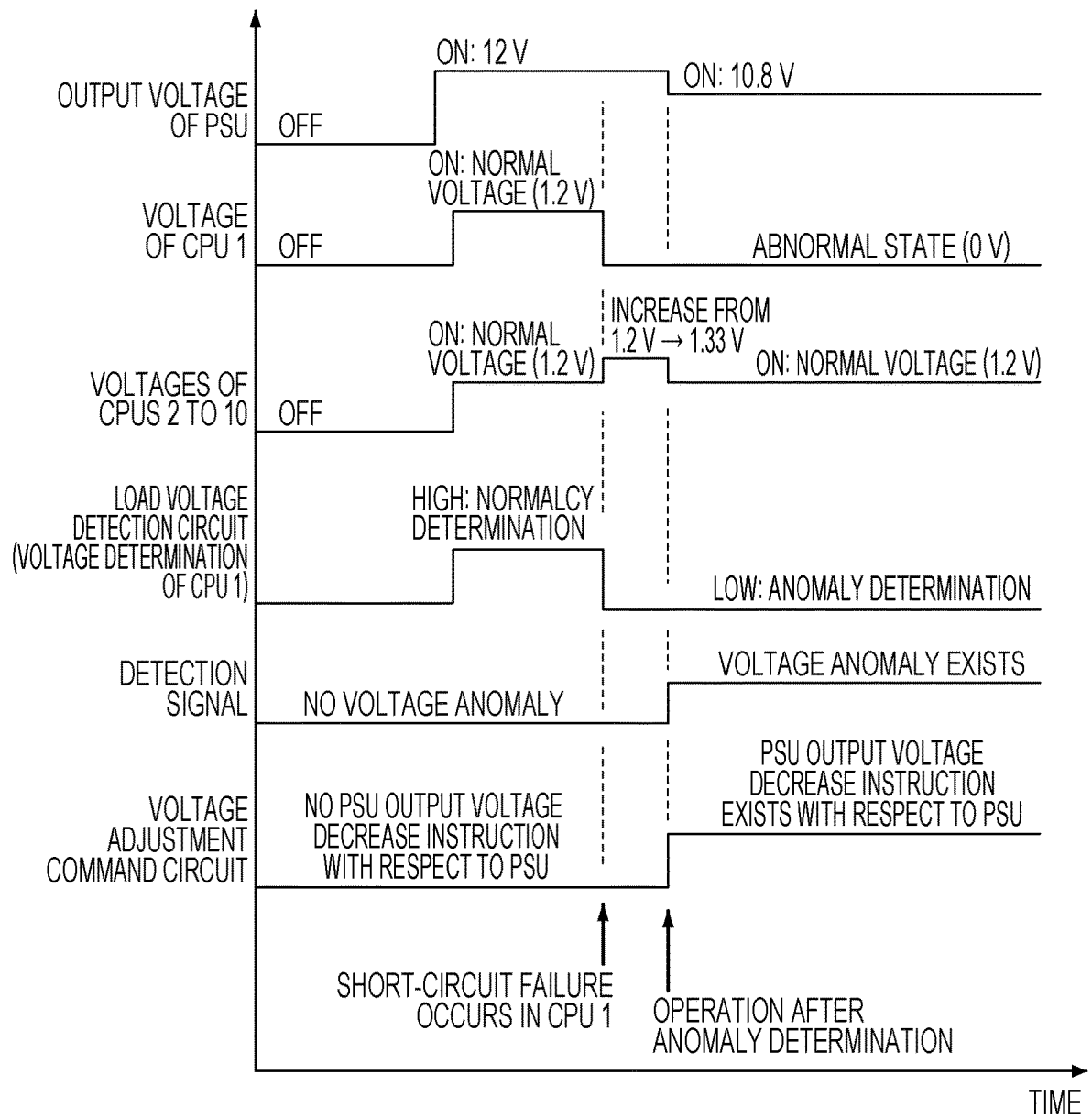
FIG. 3 is a timing chart illustrating an operation example of a power supply device according to the first embodiment.

FIG. 3 is a timing chart illustrating an operation example of the power supply device 101 according to the first embodiment. FIG. 3 exemplifies a case where a short-circuit failure occurs in the CPU 1 among the serially coupled 10 CPUs 1 to 10.

Since the 10 CPUs are coupled in series, the load voltage applied to each CPU becomes 1.2 volts obtained by equally dividing the voltage value v of the output voltage Vo (=12 [V]) by 10. When the short-circuit failure occurs in the CPU 1, the voltage value of the load voltage V1 of the CPU 1 decreases to 0 volt, and the voltage value of each of the load voltage of each of the remaining normal CPUs 2 to 10 increases to approximately 1.33 volts corresponding to a value obtained by equally dividing 12 volts by 9.

The load voltage detection circuit 30 transmits the anomaly detection signal representing that the abnormal decrease in the load voltage V1 of the CPU 1 is detected to the voltage adjustment command circuit 40. In response to the anomaly detection signal transmitted from the load voltage detection circuit 30, the voltage adjustment command circuit 40 outputs a command signal for decreasing the voltage value of the output voltage Vo by the adjust amount (1.2 volts) for one CPU to the voltage adjustment circuit 50. The voltage adjustment circuit 50 decreases the voltage value of the output voltage Vo from 12 volts to 10.8 volts following this command signal. Accordingly, the voltage value of the load voltage of each of the normal CPUs 2 to 10 decreases from 1.33 volts to 1.2 volts (voltage value obtained by equally dividing the voltage value at 10.8 volts after the output voltage Vo is decreased by 9). That is, for example, the voltage value of the load voltage of each of the normal CPUs 2 to 10 returns to the original voltage value at 1.2 volts before the anomaly occurs.

In this manner, according to the first embodiment, since the voltage value of the output voltage Vo is decreased in accordance with the number of loads where the abnormal decrease in the load voltage is detected, the stable voltage may be continually supplied to the remaining normal load devices. As a result, the remaining normal load devices may continually operate without stopping due to the decrease in the power supply voltage applied to each device. A system failure of the electronic apparatus 201 may be avoided, and reliability may be improved.

Figure 4:
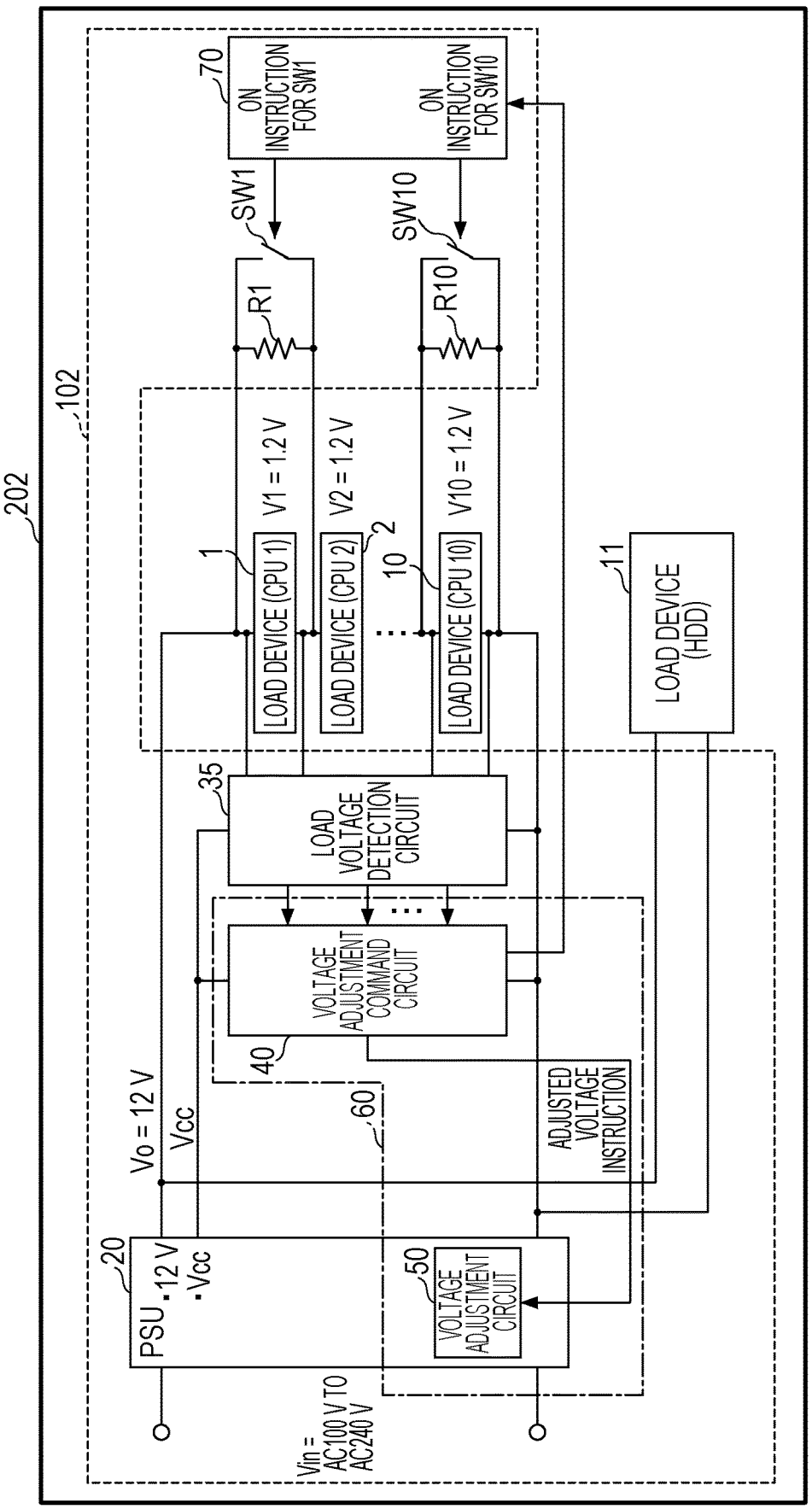
FIG. 4 is a diagram illustrating a configuration example of an electronic apparatus according to a second embodiment.

FIG. 4 is a diagram illustrating a configuration example of an electronic apparatus according to a second embodiment. An electronic apparatus 202 illustrated in FIG. 4 includes a power supply device 102 that generates direct current power and operates using the direct current power generated by the power supply device 102. Descriptions on configurations and actions similar to those of the first embodiment are omitted or simplified by using the aforementioned explanations.

Differences from the aforementioned power supply device 101 reside in that the power supply device 102 includes the same number of a plurality of switches SW1 to SWn as the plurality of load devices 1 to n, the same number of resistor devices R1 to Rn as the plurality of load devices 1 to n, and a switch drive circuit 70. FIG. 4 exemplifies 10 switches SW1 to SW10 and 10 resistor devices R1 to R10.

The plurality of switches SW1 to SWn are coupled in parallel to the corresponding load devices among the plurality of load devices 1 to n. The resistor devices R1 to R10 are coupled in parallel to the corresponding load devices among the plurality of load devices 1 to n.

A load voltage detection circuit 35 detects load voltages V1 to Vn applied to both ends of each of the plurality of respective load devices 1 to n and detects an anomaly of each of the detected load voltages V1 to Vn.

The number of the plurality of serially coupled load devices is set as n, and the voltage value of the output voltage Vo in a state where the anomalies of the load voltages V1 to Vn are not detected is set as v. At this time, the load voltage detection circuit 35 detects an abnormal decrease in the load voltages V1 to Vn by detecting that the voltage values of the load voltages V1 to Vn are low with respect to a threshold VL set to be lower than (v/n). One example of the abnormal decrease in the load voltages V1 to Vn is a voltage decrease accompanied by a short-circuit failure of the load devices 1 to n.

The load voltage detection circuit 35 detects an abnormal increase in the load voltages V1 to Vn by detecting that the voltage values of the load voltages V1 to Vn are high with respect to a threshold VH set to be higher than (v/n). For example, in the case of n=10 and v=12 [V], the threshold VH is set as a voltage value higher than 1.2 (=12/10) volts. When the set value of the threshold VH is too low, since an erroneous detection of the abnormal increase in the load voltages V1 to Vn is caused, a lower limit value of the threshold VH is preferably, for example, higher than or equal to (v/n)×1.02, and more preferably higher than or equal to (v/n)×1.03. When the set value of the threshold VH is too high, since the load voltage of each of the remaining normal load devices is excessively decreased, an upper limit value of the threshold VH is preferably, for example, lower than or equal to (v/n)×1.10, and more preferably lower than or equal to (v/n)×1.08.

One example of the abnormal increase in the load voltages V1 to Vn is a voltage increase accompanied by an open failure of the load devices 1 to n. The voltage increase accompanied by the open failure may be a voltage increase in mid-course where the load in which the abnormal voltage increase is detected leads to the open failure or may also be a voltage increase state after the load in which the abnormal voltage increase is detected has reached the open failure.

Figure 5:
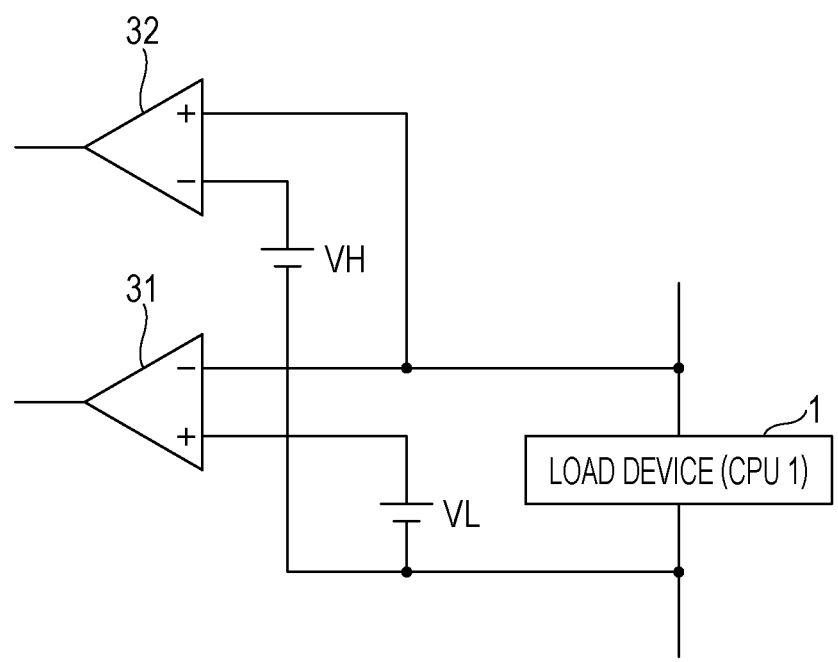
FIG. 5 is a diagram illustrating a configuration example of part of a load voltage detection circuit according to the second embodiment.

FIG. 5 is a diagram illustrating a configuration example of part of the load voltage detection circuit 35 according to the second embodiment. For example, the load voltage detection circuit 35 includes a plurality of voltage detectors coupled in parallel to corresponding load devices among the plurality of load devices 1 to n. FIG. 5 illustrates comparators 31 and 32 coupled in parallel to the load device 1 as one example of the voltage detector. The load voltage detection circuit 35 detects the abnormal decrease in each of the load voltages V1 to Vn by comparing each of the load voltages V1 to Vn with the threshold VL by n comparators 31. The load voltage detection circuit 35 detects the abnormal increase in each of the load voltages V1 to Vn by comparing each of the load voltages V1 to Vn with the threshold VH by n comparators 32.

The comparator 31 corresponding to the load voltage V1 outputs an anomaly decrease detection signal representing the presence or absence of the detection of the abnormal decrease in the load voltage V1. When the load voltage V1 is higher than the threshold VL, the comparator 31 sets a level of the anomaly decrease detection signal corresponding to the load device 1 to the non-active level (for example, the low level) representing that the abnormal decrease in the load voltage V1 is not detected. When the load voltage V1 is lower than the threshold VL, the comparator 31 sets the level of the anomaly decrease detection signal corresponding to the load device 1 to the active level (for example, the high level) representing that the abnormal decrease in the load voltage V1 is detected. The same applies to the comparators 31 respectively corresponding to the other load voltages V2 to Vn.

The comparator 32 corresponding to the load voltage V1 outputs an anomaly increase detection signal representing the presence or absence of the detection of the abnormal increase in the load voltage V1. When the load voltage V1 is lower than the threshold VH, the comparator 32 sets a level of the anomaly increase detection signal corresponding to the load device 1 to a non-active level (for example, a low level) representing that the abnormal increase in the load voltage V1 is not detected. When the load voltage V1 is higher than the threshold VH, the comparator 32 sets the level of the anomaly increase detection signal corresponding to the load device 1 to an active level (for example, a high level) representing that the abnormal increase in the load voltage V1 is detected. The same applies to the comparators 32 respectively corresponding to the other load voltages V2 to Vn.

In FIG. 4, the voltage adjustment command circuit 40 outputs a switch control signal for turning on a switch corresponding to the load device (abnormal increase load) where the abnormal increase in the load voltage among the plurality of load devices 1 to n is detected by the load voltage detection circuit 30. The voltage adjustment command circuit 40 outputs a command signal for instructing adjustment of the output voltage Vo in accordance with the number of load devices (abnormal decrease loads) where the abnormal decrease in the load voltage among the plurality of load devices 1 to n is detected by the load voltage detection circuit 30. The voltage adjustment command circuit 40 outputs a command signal for adjusting the voltage value of the output voltage Vo by an adjustment amount corresponding to the number of abnormal decrease loads.

The switch drive circuit 70 turns on the corresponding switch among the plurality of switches SW1 to SWn following a switch control signal output from the voltage adjustment command circuit 40. Before the open failure occurs in the load device, since the switch corresponding to the load device is turned on, operation stop of the remaining normal load devices caused by the open failure of the abnormal increase load may be avoided.

When the abnormal increase load completely causes the open failure, the voltage applied to each of the remaining normal load devices becomes zero. To avoid this, when the resistor devices R1 to Rn alleviate the voltage increase in mid-course where any of the abnormal increase loads among the plurality of load devices 1 to n leads to the open failure, a situation is avoided where the abnormal increase load causes the open failure before the switch corresponding to the abnormal increase load turns on.

Figure 6:
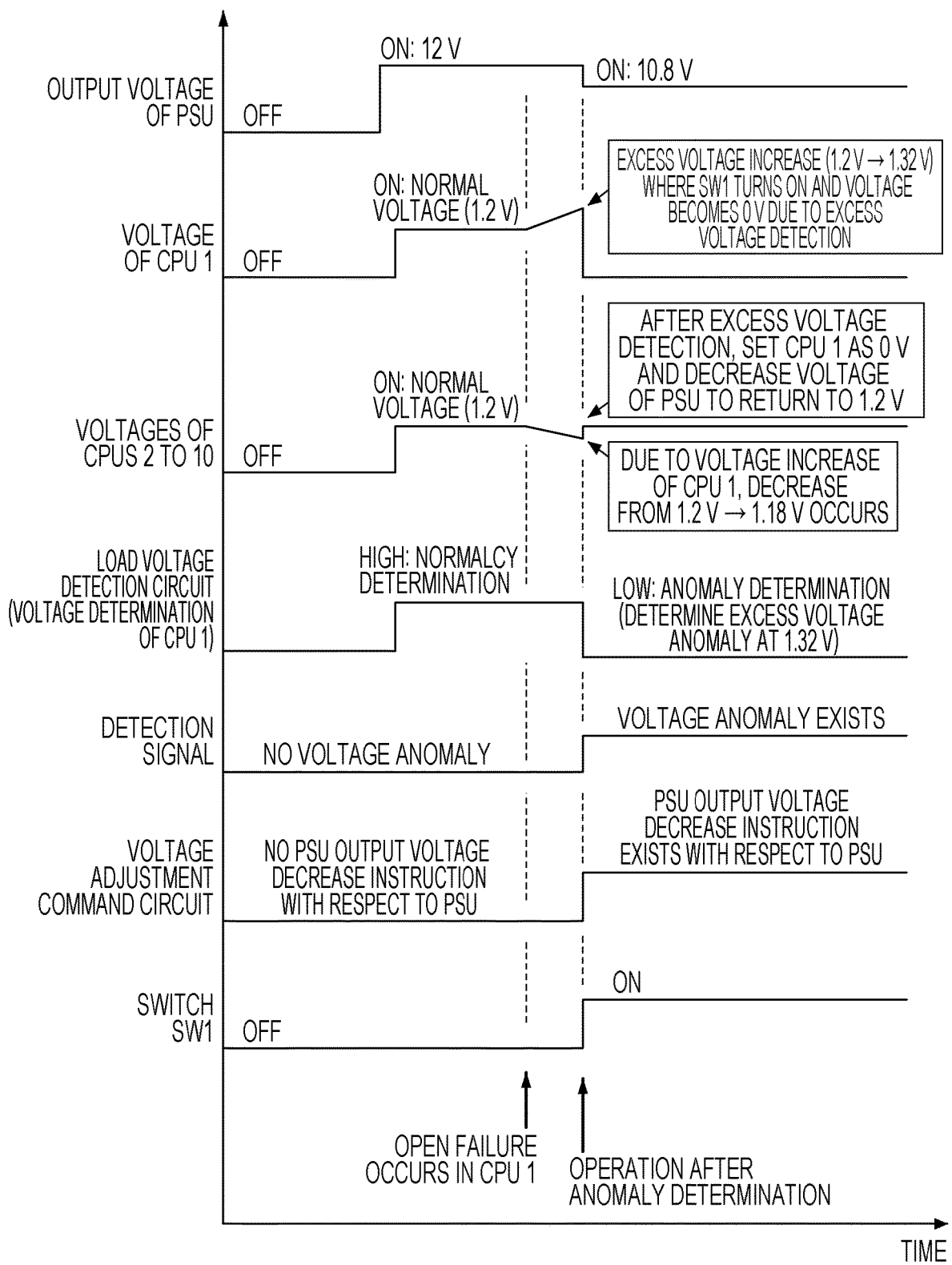
FIG. 6 is a timing chart illustrating an operation example of the power supply device according to the second embodiment.

FIG. 6 is a timing chart illustrating an operation example of the power supply device 102 according to the second embodiment. FIG. 6 exemplifies a case where a short-circuit failure occurs in the CPU 1 among the serially coupled 10 CPUs 1 to 10.

Since the 10 CPUs are coupled in series, the load voltage applied to each CPU becomes 1.2 volts obtained by equally dividing the voltage value v of the output voltage Vo (=12 [V]) by 10. When the open failure occurs in the CPU 1, the voltage value of the load voltage of the CPU 1 increases from 1.2 volts, and the voltage value of the load voltage of each of the remaining normal CPUs 2 to 10 decreases from 1.2 volts.

When the load voltage V1 of the CPU 1 exceeds the threshold VH (set as 1.32 (=(12/10)×1.1) in this case), the load voltage detection circuit 30 sets the anomaly increase detection signal of the CPU 1 as active. When the active state of the anomaly increase detection signal of the CPU 1 is detected, the switch drive circuit 70 turns on the switch SW1 coupled in parallel to the CPU 1. Accordingly, the voltage value of the load voltage V1 of the CPU 1 decreases to 0 volt.

The load voltage detection circuit 30 detects the abnormal decrease of the load voltage V1 caused by turning-on of the switch SW1 and transmits the anomaly decrease detection signal representing that this abnormal decrease is detected to the voltage adjustment command circuit 40. In response to the anomaly decrease detection signal transmitted from the load voltage detection circuit 30, the voltage adjustment command circuit 40 outputs the command signal for decreasing the voltage value of the output voltage Vo by the adjustment amount (1.2 volts) for one CPU to the voltage adjustment circuit 50. The voltage adjustment circuit 50 decreases the voltage value of the output voltage Vo from 12 volts to 10.8 volts following this command signal. Accordingly, the voltage value of the load voltage of each of the normal CPUs 2 to 10 decreases from 1.33 volts to 1.2 volts (voltage value obtained by equally dividing the voltage value at 10.8 volts after the output voltage Vo is decreased by 9). That is, for example, the voltage value of the load voltage of each of the normal CPUs 2 to 10 returns to the original voltage value at 1.2 volts before the anomaly occurs.

In this manner, according to the second embodiment, since the voltage value of the output voltage Vo is decreased in accordance with the number of loads where the abnormal decrease in the load voltage is detected after the detection of the abnormal increase of the load voltage, the stable voltage may be continually supplied to the remaining normal load devices. As a result, the remaining normal load devices may continually operate without stopping due to the decrease in the power supply voltage applied to each device. The system failure of the electronic apparatus 202 may be avoided, and reliability may be improved.

The power supply device and the electronic apparatus are described above by way of embodiments, but the present disclosure is not limited to the aforementioned embodiments. Various alterations and modifications such as combination and replacement with part or whole of other embodiments may be made within the scope of the present disclosure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power supply device comprising:
   a power supply circuit configured to generate a direct current output voltage to be applied across both ends of a plurality of loads serially coupled, the loads numbering n, where n is a first natural number;
   a detection circuit configured to detect an anomaly of a load voltage applied to each of the plurality of loads; and
   an adjustment circuit configured to decrease the output voltage, in accordance with a second natural number m of at least one abnormal load where the anomaly is detected among the plurality of loads, to reduced voltage of $v-(v/n)\times m$, where $m<n$, and v is the output voltage in a state where the anomaly is not detected.

2. The power supply device according to claim 1, wherein the anomaly includes an abnormal decrease in the load voltage.

3. The power supply device according to claim 2, wherein
   when a number of the plurality of loads is set as n, and a voltage value of the output voltage in a state where the anomaly is not detected is set as v,
   the detection circuit detects the abnormal decrease in the load voltage by detecting that the voltage value of the load voltage is lower than a threshold that is set to be lower than $v/n$,
   wherein n is a natural number and v is a real number.

4. The power supply device according to claim 2, wherein the abnormal decrease is a voltage decrease accompanied by a short-circuit failure of a load of the plurality of loads.

5. The power supply device according to claim 1, wherein the anomaly includes an abnormal increase in the load voltage.

6. The power supply device according to claim 5, wherein
   when a number of the plurality of loads is set as n, and a voltage value of the output voltage in a state where the anomaly is not detected is set as v,
   the detection circuit detects the abnormal increase in the load voltage by detecting that the voltage value of the load voltage is higher than a threshold that is set to be higher than $v/n$
   wherein n is a natural number and v is a real number.

7. The power supply device according to claim 5,
   wherein the anomaly increase is a voltage increase accompanied by an open failure of a load of the plurality of loads.

8. The power supply device according to claim 5, further comprising:
   a plurality of switches each coupled in parallel to a load of the plurality of loads,
   wherein the adjustment circuit turns on a switch of the plurality of switches coupled in parallel to the abnormal load.

9. The power supply device according to claim 1, further comprising:
   a plurality of switches each coupled in parallel to a load of the plurality of loads,
   wherein the adjustment circuit turns on a switch of the plurality of switches coupled in parallel to the abnormal load before reaching an open failure in the abnormal load.

10. A power supply device comprising:
    a power supply circuit configured to generate a direct current output voltage to be applied across both ends of a first natural number n, larger than one, of loads serially coupled;
    a detection circuit configured to detect an anomaly of a load voltage applied to each of the loads;
    a switch circuit, including switches respectively coupled in parallel to the loads, the switch circuit turning on a switch coupled in parallel to an abnormal load among the loads, where an abnormal increase of the load voltage is detected; and
    an adjustment circuit configured to adjust the output voltage, when an abnormal decrease of the load voltage of the abnormal load is detected after the one of the switches is turned on, the adjustment circuit decreasing the output voltage to $v-(v/n)\times m$, where v is a voltage value of the direct current output voltage in a state where the anomaly is not detected, and m is a second natural number less than n, of the at least one abnormal load.

11. The power supply device according to claim 10, wherein, after the switch coupled in parallel to the abnormal load is turned on before reaching an open failure in the abnormal load, when the abnormal decrease is detected, the adjustment circuit decreases the output voltage.

12. The power supply device according to claim 8, further comprising: a plurality of resistors each coupled in parallel to the load.

13. The power supply device according to claim 10, further comprising: a plurality of resistors each coupled in parallel to the load.

14. An electronic apparatus comprising:
    a plurality of loads serially coupled, the loads numbering n, where n is a first natural number;
    a power supply circuit configured to generate a direct current output voltage to be applied across both ends of the plurality of loads;
    a detection circuit configured to detect an anomaly of a load voltage applied to each of the plurality of loads; and
    an adjustment circuit configured to decrease the output voltage, in accordance with a second natural number m of at least one abnormal load where the anomaly is detected among the plurality of loads, to a reduced voltage of $v-(v/n)\times m$, where v is the output voltage in a state where the anomaly is not detected and $m<n$.

15. The electronic apparatus according to claim 14, wherein the plurality of loads are processors.

* * * * *